United States Patent
Lin et al.

(10) Patent No.: US 9,252,297 B2
(45) Date of Patent: Feb. 2, 2016

(54) OPTOELECTRONIC DEVICE AND THE MANUFACTURING METHOD THEREOF

(71) Applicant: Epistar Corporation, Hsinchu (TW)

(72) Inventors: Yi-Hung Lin, Hsinchu (TW); Cheng-Hong Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 274 days.

(21) Appl. No.: 13/693,531

(22) Filed: Dec. 4, 2012

(65) Prior Publication Data

US 2014/0150858 A1    Jun. 5, 2014

(51) Int. Cl.

| | |
|---|---|
| *H01L 27/15* | (2006.01) |
| *H01L 31/0216* | (2014.01) |
| *H01L 31/0224* | (2006.01) |
| *H01L 31/0735* | (2012.01) |
| *H01L 31/18* | (2006.01) |

(52) U.S. Cl.
CPC .. *H01L 31/02168* (2013.01); *H01L 31/022425* (2013.01); *H01L 31/0735* (2013.01); *H01L 31/1888* (2013.01); *Y02E 10/50* (2013.01)

(58) Field of Classification Search
CPC ..................................... H01L 33/0004–33/648
See application file for complete search history.

(56) References Cited

U.S. PATENT DOCUMENTS

| | | | | |
|---|---|---|---|---|
| 5,451,977 | A  * | 9/1995  | Kusuda et al. | 345/44 |
| 5,977,566 | A  * | 11/1999 | Okazaki et al. | 257/99 |
| 2007/0166861 | A1* | 7/2007  | Jeon et al. | 438/39 |
| 2008/0308832 | A1* | 12/2008 | Hsieh et al. | 257/98 |
| 2011/0121270 | A1* | 5/2011  | Kim et al. | 257/40 |
| 2011/0163327 | A1* | 7/2011  | Ueno et al. | 257/79 |
| 2012/0049232 | A1* | 3/2012  | Okabe et al. | 257/98 |
| 2012/0273827 | A1* | 11/2012 | Wei et al. | 257/99 |

FOREIGN PATENT DOCUMENTS

TW        1317565      11/2009

* cited by examiner

*Primary Examiner* — David Vu
*Assistant Examiner* — Cuong Nguyen
(74) *Attorney, Agent, or Firm* — Patterson & Sheridan, LLP

(57) ABSTRACT

An optoelectronic device comprises an optoelectronic semiconductor stack layer; a conductive layer on the optoelectronic semiconductor stack layer, the conductive layer comprising a top surface, a bottom surface opposite to the top surface, and a side surface; a first barrier layer covering the top surface; a second barrier layer covering the bottom surface; and a first metal oxide layer, wherein the first metal oxide layer covers the side surface, the first barrier layer, and the second barrier layer.

16 Claims, 7 Drawing Sheets

OPTOELECTRONIC DEVICE AND THE MANUFACTURING METHOD THEREOF

TECHNICAL FIELD

The application relates to an optoelectronic device and the method for manufacturing the optoelectronic device.

DESCRIPTION OF BACKGROUND ART

Because of the shortage of the petroleum energy resource and the promotion of the environment protection, people continuously and actively study the art related to the replaceable energy and the regenerative energy resources in order to reduce the dependence of petroleum energy resource and the influence on the environment. The solar cell is an attractive candidate among those replaceable energy and the regenerative energy resources because the solar cell can directly convert solar energy into electricity. In addition, there are no harmful substances like carbon oxide or nitride generated during the process of generating electricity so there is no pollution to the environment.

The basic structure of a solar-cell element includes an optoelectronic semiconductor stack layer, an upper electrode formed on the upper surface of the optoelectronic semiconductor stack layer, and a back electrode formed on the bottom surface of the optoelectronic semiconductor stack layer. Furthermore, for receiving most solar light, the upper surface of the optoelectronic stack may be covered by an anti-reflecting layer.

The solar-cell element can further connect to a base via a bonding layer to form a light-absorbing device. In additional, the base can further include at least a circuit to electrically connect to the electrode of the solar cell element via a conductive structure such as metal wire.

SUMMARY OF THE DISCLOSURE

An optoelectronic device comprises an optoelectronic semiconductor stack layer, a conductive layer on the optoelectronic semiconductor stack layer, the conductive layer comprising a top surface, a bottom surface opposite to the top surface, and a side surface, a first barrier layer covering the top surface, a second barrier layer covering the bottom surface, and a first metal oxide layer, wherein the first metal oxide layer covers the side surface, the first barrier layer and the second barrier layer.

A method of manufacturing an optoelectronic device comprises the steps of providing an optoelectronic semiconductor stack layer; forming a second barrier layer on semiconductor stack layer; forming a conductive layer on the second barrier layer, the conductive layer comprising a side surface; forming a first barrier layer on the conductive layer; and providing a first metal oxide layer by oxidizing the first barrier layer, the conductive layer, and the second barrier layer so the first metal oxide layer covers the side surface.

DETAILED DESCRIPTION OF PREFERRED EMBODIMENTS

Figure 1:
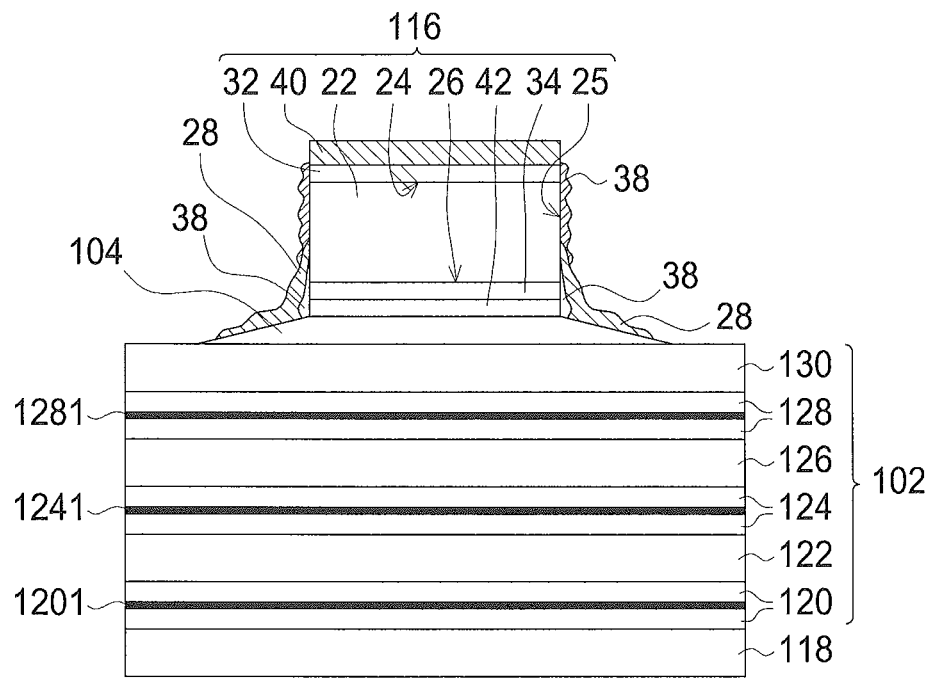
FIG. 1 shows the optoelectronic device in accordance with the first embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

First Embodiment

As shown in FIG. 1, the optoelectronic device comprises a semiconductor stack layer 102, an ohmic contact layer 104 on the optoelectronic semiconductor stack layer 102, and an upper electrode 116 on the ohmic contact layer 104.

The optoelectronic device of the first embodiment can be a solar-cell device and can include: a back electrode 118; the optoelectronic semiconductor stack 102 including: a conductive substrate 120 having a first junction 1201 formed on the back electrode 118, wherein the first junction 1201 is formed by doping two different materials in the conductive substrate 120; a first tunnel junction 122 formed on the conductive substrate 120; a first semiconductor layer 124 formed on the first tunnel junction 122, wherein the first semiconductor layer 124 has a second junction 1241 formed by sequentially doping two different materials therein during epitaxial growth process; a second tunnel junction 126 formed on the first semiconductor layer 124; and a second semiconductor layer 128 formed on the second tunnel junction 126, wherein the second semiconductor layer 128 has a third junction 1281 formed by sequentially doping two different materials therein during epitaxial growth process. The first junction 1201, second junction 1241 and third junction 1281 include p-n junction or p-i-n junction. The material of the conductive substrate 120 can be Ge, and the material of the first semiconductor layer 124 can be GaAs, and the material of the second semiconductor layer 128 can be InGaP. The first tunnel junction 120 and the second tunnel junction 126 can include InGaAs/AlGaInAs junction and InGaP/AlGaInAs junction, respectively.

The optoelectronic device further includes a light-absorbing layer 130 on the second semiconductor layer 128 for receiving more light from outside, and the material of the light-absorbing layer 130 can include AlInP.

The upper electrode 116 substantially has a conductive layer 22, a first barrier layer 32, a second barrier layer 34, and a bonding layer 40. The conductive layer 22 has a top surface 24, a bottom surface 26 opposite to the top surface 24, and a side surface 25. The first barrier layer 32 covers the top surface 24, and the second barrier layer 34 covers the bottom surface 26. The bonding layer 40 is on the first barrier layer 32. The bonding layer 40 is used for wire bonding. The bonding layer 40 comprises Au. The ohmic contact layer 104 is formed between the second barrier layer 34 and the semiconductor stack layer 102. The ohmic contact layer 104 is operable to electrically connect the semiconductor stack layer 102 and the upper electrode 116. A metal layer 42 is formed between the second barrier layer 34 and the ohmic contact layer 104 to reduce the contact resistance between the barrier layer 34 and the ohmic contact layer 104. The metal layer 42 comprises Ni, Ge, Au or the alloy thereof. The portion of the ohmic contact layer 104, which is not covered by the upper electrode 116, is etched by an etching solution containing $H_2O_2$. The upper electrode 116 can be operable to be the etching resistor layer to prevent the etching solution containing $H_2O_2$ from etching the portion of the ohmic contact layer 104 covered by the upper electrode 116.

Conventionally, the material of the electrode the optoelectronic device is formed by Au, but the cost of Au has been largely raised year by year, and therefore a portion of Au is replaced by Ag for the material of the electrode. However, Ag is oxidized easily by the etching solution containing $H_2O_2$ than Au to form the metal oxide. Accordingly, for the upper electrode 116, the conductive layer 22 is formed of Ag, and both of the first barrier layer 32 and the second barrier layer 34 comprise Pd. The thickness of the conductive layer 22 is in a range of 3 µm to 9 µm. The thickness of each of the first barrier layer 32 and the second barrier layer 34 is equal to or larger than 5 nm. During the process of etching the ohmic contact layer 104 by the etching solution containing $H_2O_2$, the first metal oxide layer 38 is formed by the first barrier layer 32 and the second barrier layer 34 oxidized by the etching solution containing $H_2O_2$. Because the first barrier layer 32 and the second barrier layer 34 comprises Pd, the first metal oxide layer 38 is formed on the surface of the first barrier layer 32 and the second barrier layer 34, and on the side surface 25 near the first barrier layer 32 and the second barrier layer 34 to protect the conductive layer 22. The first metal oxide layer 38 comprises Pd. As the first metal oxide layer 38 formed on the conductive layer 22, the first metal oxide layer 38 can avoid the conductive layer 22 being oxidized by the etching solution containing $H_2O_2$. Because it is difficult for the first metal oxide layer 38 to cover the whole side surface 25, the portion of the side surface 25 of the conductive layer 22 not covered by the first metal oxide layer 38 is oxidized by the etching solution containing $H_2O_2$. When the conductive layer 22 is oxidized by the etching solution containing $H_2O_2$, the second metal oxide layer 28 is formed. The second metal oxide layer 28 comprises Ag. During the process of etching the ohmic contact layer 104 by the etching solution containing $H_2O_2$, the second metal oxide layer 28 flows to cover the ohmic contact layer 104 and stop the etching solution containing $H_2O_2$ from etching the ohmic contact layer 104. Thus, the ohmic contact layer 104 is wider than the upper electrode 116.

Second Embodiment

Figure 2:
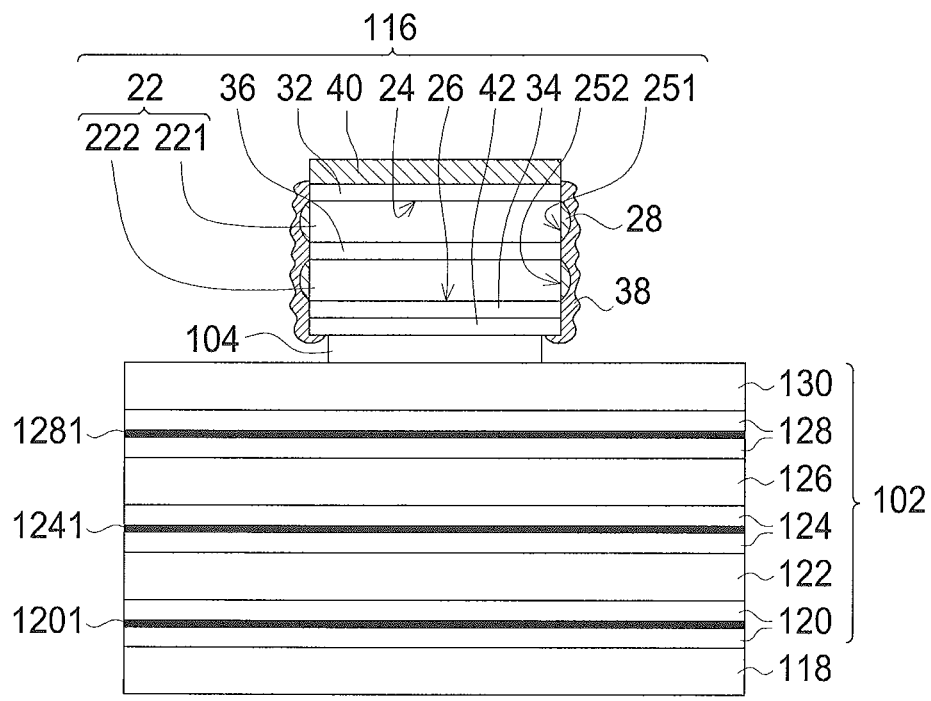
FIG. 2 shows the optoelectronic device in accordance with the second embodiment of the present application.

FIG. 2 shows a schematic structure of the optoelectronic device disclosed in the second embodiment of the present application. The difference between the second embodiment and the first embodiment is that the upper electrode 116 comprises a third barrier layer 36 to separate the conductive layer 22 to a first sub-conductive layer 221 comprising a first side surface 251 and a second sub-conductive layer 222 comprising a second side surface 252. The third barrier layer 36 comprises Pd. The thickness of each of the third barrier layer 36, the first barrier layer 32 and the second barrier layer 34 is equal to or larger than 5 nm. Both of the first sub-conductive layer 221 and the second sub-conductive layer 222 are formed of Ag. The thickness of each of the first sub-conductive layer 221 and the second sub-conductive layer 222 is in a range of 1.5 µm to 4.5 µm. The thickness ratio of the first sub-conductive layer 221 to each of the first barrier layer 32 and the third barrier layer 36 is preferably equal to or smaller than 300. The thickness ratio of the second sub-conductive layer 222 to each of the second barrier layer 34 and the third barrier layer 36 is preferably equal to or smaller than 300. The ohmic contact layer 104 is usually formed of GaAs, which is an opaque material. Because the ohmic contact layer 104 is opaque, the ohmic contact layer 104 below the upper electrode 116 is preferred to be covered by the upper electrode 116 so the light can have more chances to go into the light-absorbing layer 130. The portion of the ohmic contact layer 104 uncovered by the upper electrode 116 is etched by the etching solution containing $H_2O_2$. The upper electrode 116 is operable to be the etching resistor layer to prevent the etching solution containing $H_2O_2$ from etching the portion of the ohmic contact layer 104 covered by the upper electrode 116. When the upper electrode 116 contacts the etching solution containing $H_2O_2$, the first barrier layer 32, the second barrier layer 34, and the third barrier layer 36 are oxidized by the etching solution containing $H_2O_2$ to form a first metal oxide layer 38, and the first sub-conductive layer 221 and the second sub-conductive layer 222 are also oxidized by the etching solution containing $H_2O_2$ to form a second metal oxide layer 28 on the first side surface 251 and the second side surface 252. Because the reaction rate of Ag and $H_2O_2$ is slower than that of Pd and $H_2O_2$, the rate of forming the second metal oxide layer 28 is lower than that of forming the first metal oxide layer 38. Since the thickness of each of the first sub-conductive layer 221 and the second sub-conductive layer 222 is in a range of 1.5 µm to 4.5 µm which is small enough for the first metal oxide 38 to cover the whole first side surface 251, the whole second side surface 252, and the whole second metal oxide layer 28 before there are too much the second metal oxide layer 28 formed to contact the ohmic contact layer 104, the second metal oxide layer 28 does not form on the ohmic contact layer 104. Therefore, the portion of the ohmic contact layer 104 uncovered by the upper electrode 116 is etched by the etching solution containing $H_2O_2$ so the ohmic contact layer 104 is entirely covered by the upper electrode 116.

Third Embodiment

Figure 3A:
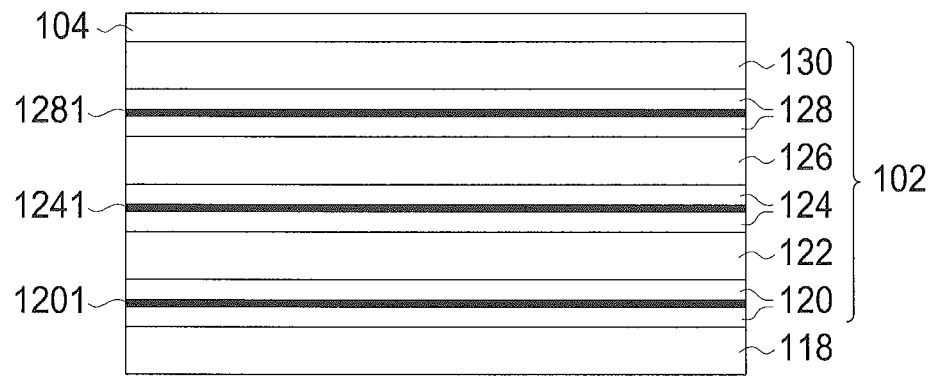
FIGS. 3A to 3E show a method for manufacturing an optoelectronic device in accordance with the third embodiment of the present application.

As shown in FIGS. 3A to 3E, a method for manufacturing an optoelectronic semiconductor device in accordance with the third embodiment of the present application is disclosed. Referring to FIG. 3A, an optoelectronic semiconductor stack layer 102 is provided on a back electrode 118. The optoelectronic semiconductor stack 102 including: a conductive substrate 120 having a first junction 1201 formed on the back electrode 118, wherein the first junction 1201 is formed by doping two different materials in the conductive substrate 120; a first tunnel junction 122 formed on the conductive substrate 120; a first semiconductor layer 124 formed on the first tunnel junction 122, wherein the first semiconductor layer 124 has a second junction 1241 formed by sequentially doping two different materials therein during epitaxial growth process; a second tunnel junction 126 formed on the first semiconductor layer 124; and a second semiconductor layer 128 formed on the second tunnel junction 126, wherein the second semiconductor layer 128 has a third junction 1281 formed by sequentially doping two different materials therein during epitaxial growth process; a light-absorbing layer 130 formed on the second semiconductor layer 128 for receiving more light from outside, and the material of the light-absorbing layer 130 can include AlInP. The first junction 1201, second junction 1241, and third junction 1281 include p-n junction or p-i-n junction. The material of the conductive substrate 120 can be Ge, the material of the first semiconductor layer 124 can be GaAs, and the material of the second semiconductor layer 128 can be InGaP. The first tunnel junction 120 and the second tunnel junction 126 can include InGaAs/AlGaInAs junction and InGaP/AlGaInAs junction, respectively. An ohmic contact layer 104 formed on the light-absorbing layer 130 is formed of GaAs.

Figure 3B:
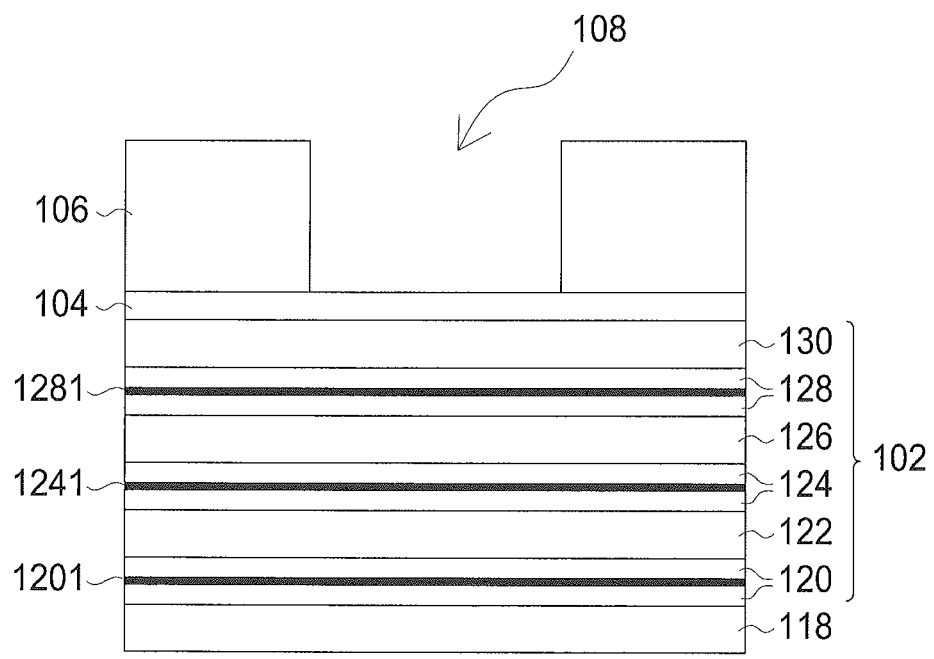

Referring to FIG. 3B, a mask layer 106 is formed on the ohmic contact layer 104, and an opening 108 having a pattern is formed through the mask layer 106 to expose a partial region of the ohmic contact layer 104. The mask layer 106 can be a photo resistor.

Figure 3C:
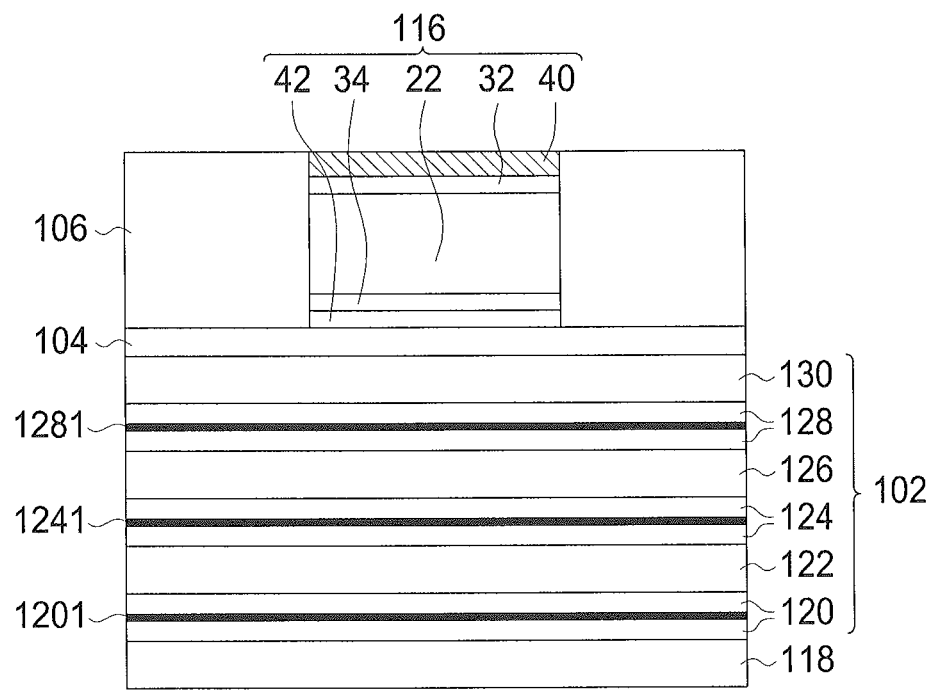

Referring to FIG. 3C, forming an upper electrode 116 on the ohmic contact layer 104 corresponding to the opening 108 includes the following steps. A metal layer 42 is formed on the ohmic contact layer 104 corresponding to the opening 108. The metal layer 42 comprises Ni, Ge, Au, or the alloy thereof. A second barrier layer 34 is formed on metal layer 42 corresponding to the opening 108. The second barrier layer 34 comprises Pd. A conductive layer 22 is formed on the second barrier layer 34 corresponding to the opening 108. The conductive layer 22 comprises Ag. A first barrier layer 32 is formed on the conductive layer 22 corresponding to the opening 108. The material of the first barrier layer 32 is the same as the second barrier layer 34. The thickness of the conductive layer 22 is in a range of 3 µm to 9 µm. The thickness of each of the first barrier layer 32 and the second barrier layer 34 is equal to or larger than 5 nm. A bonding layer 40 is formed on the first barrier layer 32 corresponding to the opening 108. The bonding layer 40 comprises Au.

Figure 3D:
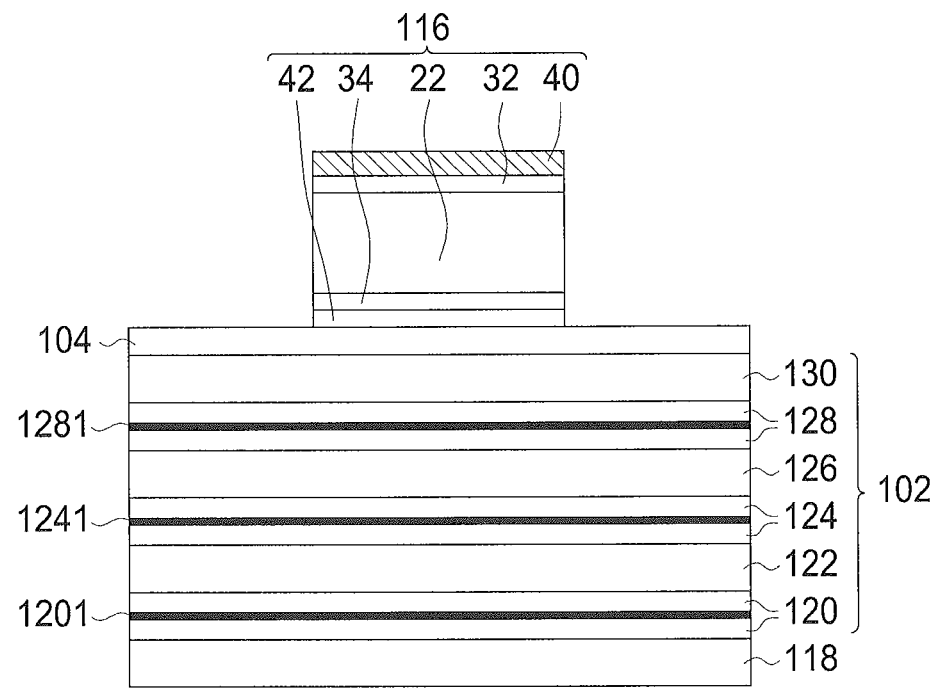

Referring to FIG. 3D, the mask layer 106 is removed. The mask layer 106 can be removed by solvent such as organic solvent or inorganic solvent, or by ion etching such as $O_2$ plasma or Ar plasma.

Figure 3E:
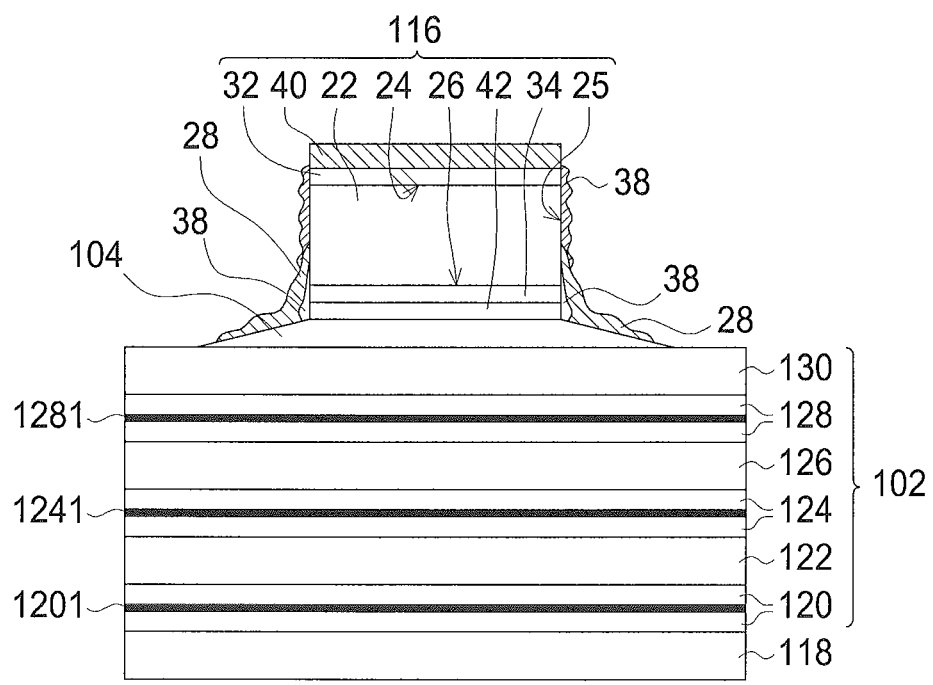

Referring to FIG. 3E, the ohmic contact layer 104 is etched by the etching solution containing $H_2O_2$. The upper electrode 116 is operable to be the etching resistor layer to prevent the etching solution containing $H_2O_2$ from etching the portion of the ohmic contact layer 104 covered by the upper electrode 116. The first barrier layer 32 and the second barrier layer 34 are oxidized by the etching solution containing $H_2O_2$ to form a first metal oxide layer 38 on the side surface 25 of the upper electrode 116. The conductive layer 22 is oxidized by the etching solution containing $H_2O_2$ to form a second metal oxide layer 28 on the side surface 25 and flowing to cover a portion of the ohmic contact layer 104 uncovered by the upper electrode 116. The first metal oxide layer 38 comprises Pd and the second metal oxide layer 28 comprises Ag. The second metal oxide layer 28 can protect the ohmic contact layer 104 from being etched by the etching solution containing $H_2O_2$, so the ohmic contact layer 104 uncovered by the upper electrode 116 is not completely etched by the etching solution containing $H_2O_2$. In other words, the portion of the ohmic contact layer 104 covered by the second metal oxide layer 28 is still on the light-absorbing layer 130, therefore, the ohmic contact layer 104 is wider than the upper electrode 116.

Fourth Embodiment

Figure 4A:
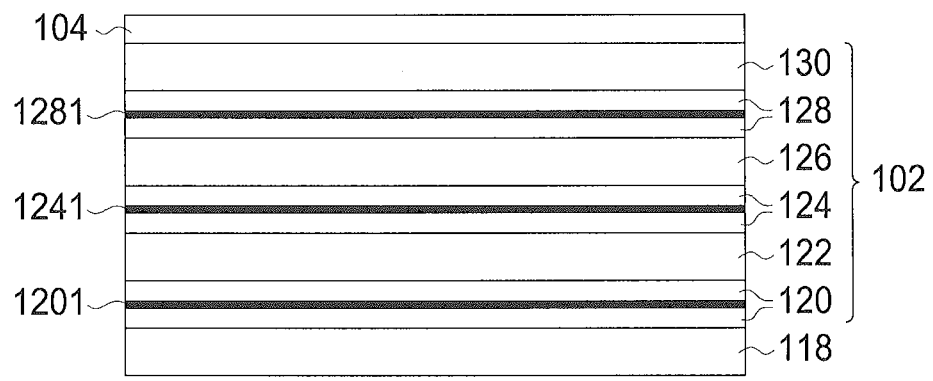
FIGS. 4A to 4E show a method for manufacturing an optoelectronic device in accordance with the fourth embodiment of the present application.

As shown in FIGS. 4A to 4E, a method for manufacturing an optoelectronic semiconductor device in accordance with the fourth embodiment of the present application is disclosed. Referring to FIG. 4A, an optoelectronic semiconductor stack layer 102 is provided on a back electrode 118. The optoelectronic semiconductor stack 102 including: a conductive substrate 120 having a first junction 1201 formed on the back electrode 118, wherein the first junction 1201 is formed by doping two different materials in the conductive substrate 120; a first tunnel junction 122 formed on the conductive substrate 120; a first semiconductor layer 124 formed on the first tunnel junction 122, wherein the first semiconductor layer 124 has a second junction 1241 formed by sequentially doping two different materials therein during epitaxial growth process; a second tunnel junction 126 formed on the first semiconductor layer 124; and a second semiconductor layer 128 formed on the second tunnel junction 126, wherein the second semiconductor layer 128 has a third junction 1281 formed by sequentially doping two different materials therein during epitaxial growth process; a light-absorbing layer 130 formed on the second semiconductor layer 128 for receiving more light from outside, and the material of the light-absorbing layer 130 can include AlInP. The first junction 1201, second junction 1241 and third junction 1281 include p-n junction or p-i-n junction. The material of the conductive substrate 120 can be Ge, the material of the first semiconductor layer 124 can be GaAs, and the material of the second semiconductor layer 128 can be InGaP. The first tunnel junction 120 and the second tunnel junction 126 can include InGaAs/AlGaInAs junction and InGaP/AlGaInAs junction, respectively. An ohmic contact layer 104 formed on the light-absorbing layer 130 is formed of GaAs.

Figure 4B:
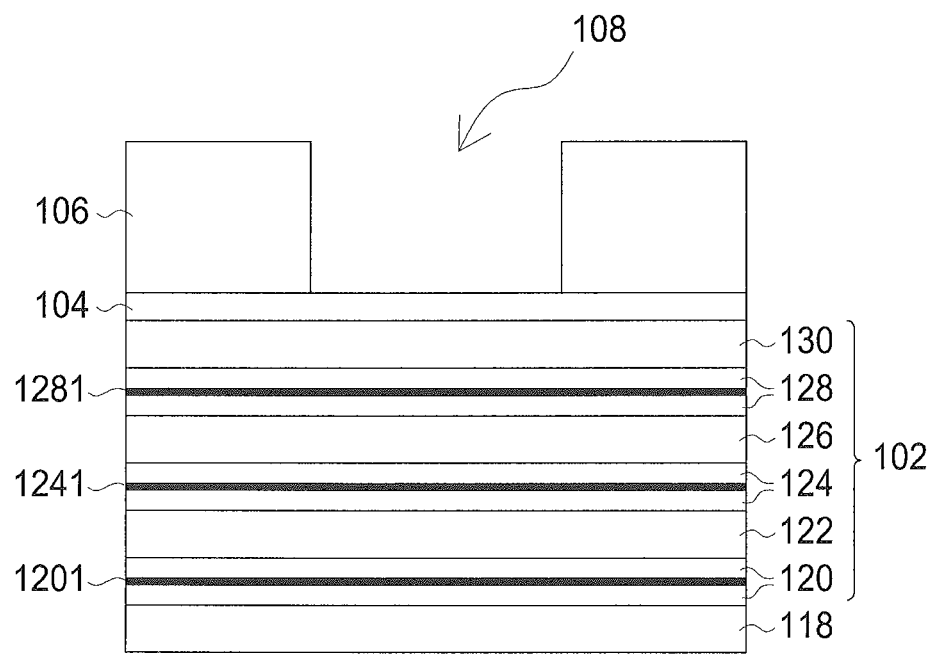

Referring to FIG. 4B, a mask layer 106 is formed on the ohmic contact layer 104, exposed and developed to form a pattern, and then is etched according to the pattern by solvent such as organic solvent or inorganic solvent, or by ion etching such as $O_2$ plasma or Ar plasma to form an opening 108. The opening 108 having a pattern corresponding with the pattern on the mask layer 106 to expose a partial region of the ohmic contact layer 104. The mask layer 106 can be a photo resistor.

Figure 4C:
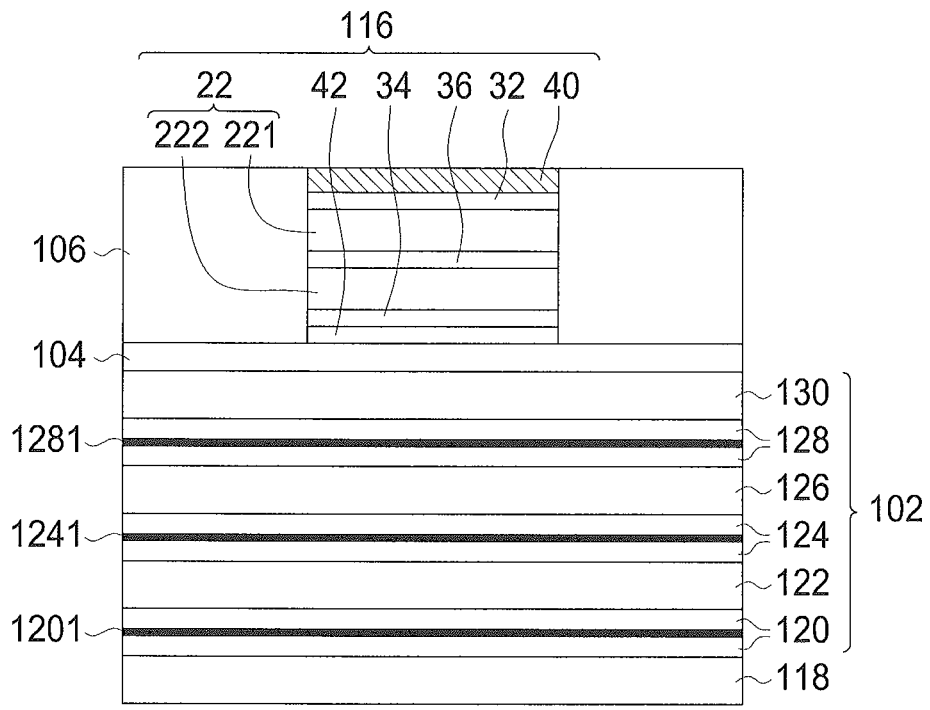

Referring to FIG. 4C, forming an upper electrode 116 on the ohmic contact layer 104 corresponding to the opening 108 has the following steps. A metal layer 42 is formed on the ohmic contact layer 104 corresponding to the opening 108. The metal layer 42 comprises Ni, Ge, Au, or the alloy thereof. A second barrier layer 34 is formed on the metal layer 42 corresponding to the opening 108. The second barrier layer 34 comprises Pd. A second sub-conductive layer 222 is formed on the second barrier layer 34 corresponding to the opening 108. The second sub-conductive layer 222 comprises Ag. A third barrier layer 36 is formed on the second sub-conductive layer 222 corresponding to the opening 108. The material of third barrier layer 36 is the same as the second barrier layer 34. A first sub-conductive layer 221 is formed on the third barrier layer 36 corresponding to the opening 108. The material of the first sub-conductive layer 221 is the same as the second sub-conductive layer 222. A first barrier layer 32 is formed on the first sub-conductive layer 221 corresponding to the opening 108. The material of first barrier layer 32 is the same as the second barrier layer 34 and the third barrier layer 36. The thickness of each of the first barrier layer 32, the second barrier layer 34, and the third barrier layer 36 is equal to or larger than 5 nm. The thickness of each of the first sub-conductive layer 221 and the second sub-conductive layer 222 is in a range of 1.5 µm to 4.5 µm. The thickness ratio of each of the first sub-conductive layer 221 and the second sub-conductive layer 222 to each of the first barrier layer 32, the second barrier layer 34, and the third barrier layer 36 is equal to or smaller than 300. A bonding layer 40 is formed on the second barrier layer 32 corresponding to the opening 108. The bonding layer 40 comprises Au.

Figure 4D:
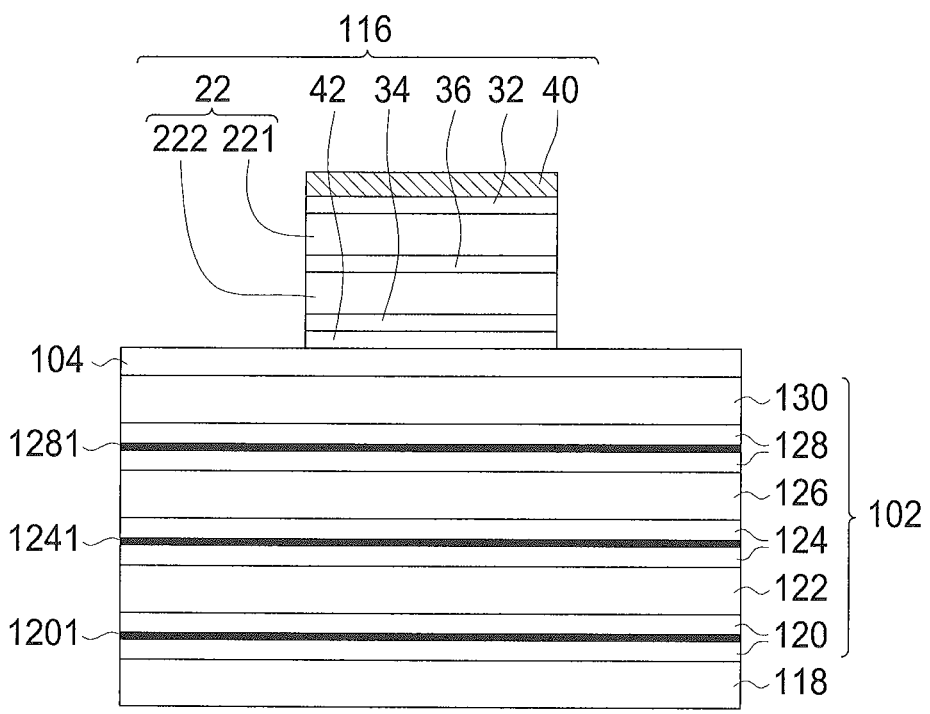

Referring to FIG. 4D, the mask layer 106 is removed. The mask layer 106 can be removed by solvent such as organic solvent or inorganic solvent, or by ion etching such as $O_2$ plasma or Ar plasma.

Figure 4E:
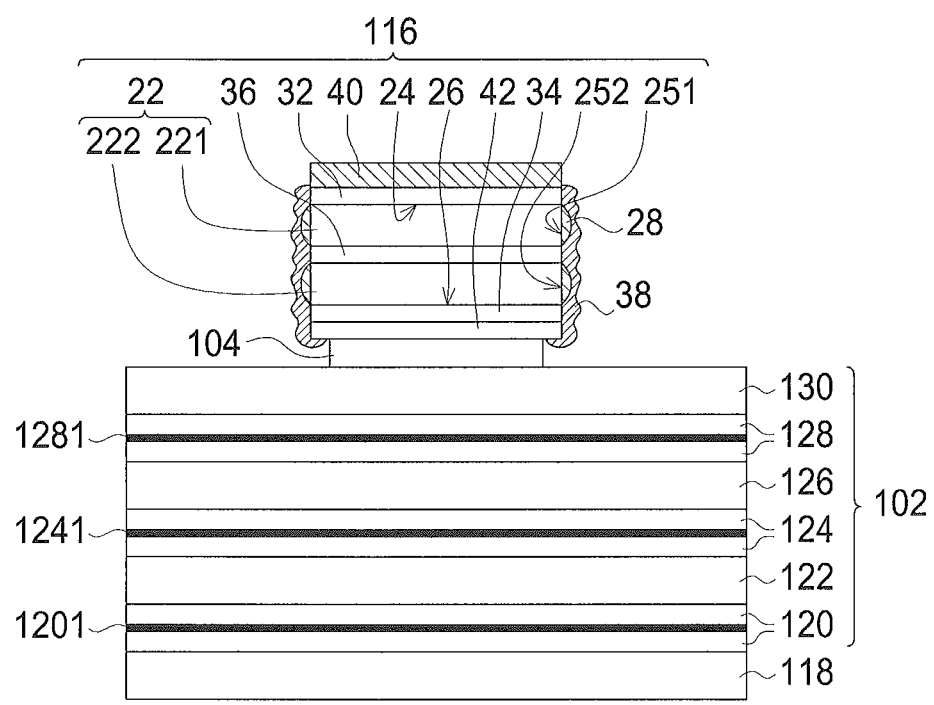

Referring to FIG. 4E, a part of the ohmic contact layer 104 is etched by the etching solution containing $H_2O_2$ so the remaining ohmic contact layer 104 is entirely covered by the upper electrode 116. The upper electrode 116 is operable to be the etching resistor layer during the process of the ohmic contact layer 104 etched by the etching solution containing $H_2O_2$. The first sub-conductive layer 221 comprises a first side surface 251 and the second sub-conductive layer 222 comprises a second side surface 252. A first metal oxide layer 38 is formed by oxidizing the first barrier layer 32, the second barrier layer 34 and the third barrier layer 36 with the etching solution containing $H_2O_2$. The first sub-conductive layer 221 and the second sub-conductive layer 222 are also oxidized by the etching solution containing $H_2O_2$ to form a second metal oxide layer 28 on the first side surface 251 and the second side surface 252. Because the reaction rate of Ag and $H_2O_2$ is slower than that of Pd and $H_2O_2$, the rate of forming the second metal oxide layer 28 is lower than that of forming the first metal oxide layer 38. Since the thickness of each of the first sub-conductive layer 221 and the second sub-conductive layer 222 is in a range of 1.5 µm to 4.5 µm which is small enough for the first metal oxide 38 to cover the whole first side surface 251, the whole second side surface 252, and the whole second metal oxide layer 28 before there is too much of the second metal oxide 28 formed to contact the ohmic contact layer 104, the second metal oxide layer 28 does not form on the ohmic contact layer 104. Therefore, the portion of the ohmic contact layer 104 uncovered by the upper electrode 116 is etched by the etching solution containing $H_2O_2$ so the ohmic contact layer 104 is entirely covered by the upper electrode 116.

What is claimed is:

1. An optoelectronic device, comprising:
   an optoelectronic semiconductor stack layer;
   a conductive layer on the optoelectronic semiconductor stack layer, the conductive layer comprising a top surface, a bottom surface opposite to the top surface, and a side surface connecting between the top and the bottom surface;
   a first barrier layer covering the top surface; a second barrier layer covering the bottom surface; and
   a first metal oxide layer, wherein the first metal oxide layer covers the side surface, the first barrier layer, and the second barrier layer, and wherein the first metal oxide layer is in direct contact with the side surface of the conductive layer, wherein the first barrier layer and the second barrier layer comprise Pd.

2. An optoelectronic device according to claim 1, further comprises a second metal oxide layer between the first metal oxide layer and the side surface.

3. An optoelectronic device according to claim 1, wherein the thickness ratio of the conductive layer to the first barrier layer or the second barrier layer is equal to or smaller than 300.

4. An optoelectronic device according to claim 3, wherein the thickness of the conductive layer is in a range of 3 µm to 9 µm.

5. An optoelectronic device according to claim 3, wherein the thickness of the first barrier layer or the second barrier layer is equal to or greater than 5 nm.

6. An optoelectronic device according to claim 1, wherein the material of the conductive layer comprises Ag.

7. An optoelectronic device according to claim 1, wherein the conductive layer further comprises a first sub-conductive layer, a second sub-conductive layer, and a third barrier layer to separate the first sub-conductive layer and the second sub-conductive layer.

8. An optoelectronic device according to claim 7, wherein the thickness ratio of the first sub-conductive layer or the second sub-conductive layer to the third barrier layer is equal to or smaller than 300.

9. An optoelectronic device according to claim 8, wherein the thickness of the first sub-conductive layer or the second sub-conductive layer is in a range of 1.5 µm to 4.5 µm.

10. An optoelectronic device according to claim 8, wherein the thickness of the third barrier layer is equal to or greater than 5 nm.

11. An optoelectronic device according to claim 7, wherein the material of the first sub-conductive layer and the second sub-conductive layer comprises Ag.

12. An optoelectronic device according to claim 7, wherein the third barrier layer comprises Pd.

13. An optoelectronic device according to claim 1, further comprises an ohmic contact layer between the semiconductor stack layer and the conductive layer.

14. An optoelectronic device according to claim 13, wherein the material of the ohmic contact layer comprises GaAs.

15. An optoelectronic device according to claim 1, wherein the first metal oxide layer comprises Pd.

16. An optoelectronic device according to claim 2, wherein the second metal oxide layer comprises Ag.

* * * * *